(12) United States Patent
Zhong et al.

(10) Patent No.: US 10,162,996 B2
(45) Date of Patent: Dec. 25, 2018

(54) LATCHUP RECOVERY MECHANISM FOR FINGERPRINT SENSOR BASED ON STATE MONITOR AND HANDSHAKE

(71) Applicant: Shenzhen Goodix Technology Co., Ltd., Shenzhen (CN)

(72) Inventors: Hua Zhong, Shenzhen (CN); Jinchun Ye, Shenzhen (CN); Shunzhan Li, Shenzhen (CN); Jinhui Lin, Shenzhen (CN)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 503 days.

(21) Appl. No.: 14/941,530

(22) Filed: Nov. 13, 2015

(65) Prior Publication Data

US 2016/0140377 A1 May 19, 2016

(30) Foreign Application Priority Data

Nov. 14, 2014 (WO) ................ PCT/CN2014/091179

(51) Int. Cl.
*G06K 9/20* (2006.01)
*G06K 9/00* (2006.01)
*H01L 27/02* (2006.01)

(52) U.S. Cl.
CPC ...... *G06K 9/00053* (2013.01); *H01L 27/0248* (2013.01)

(58) Field of Classification Search
CPC ................. G06K 9/00006–9/0012; H01L 27/0248–27/0296
See application file for complete search history.

(56) References Cited

U.S. PATENT DOCUMENTS

| | | | |
|---|---|---|---|
| 6,661,631 B1 * | 12/2003 | Meador | G06K 9/00013 361/93.1 |
| 2003/0025606 A1 * | 2/2003 | Sabatini | G06K 9/00053 340/635 |
| 2007/0207681 A1 * | 9/2007 | Zabroda | G06K 9/00053 439/717 |
| 2008/0266737 A1 * | 10/2008 | Conway | G06K 9/00013 361/87 |

* cited by examiner

*Primary Examiner* — Brian Werner
(74) *Attorney, Agent, or Firm* — Perkins Coie LLP

(57) ABSTRACT

Devices and methods are provided for recovering from latchup state in fingerprint sensor devices. For example, a disclosed device can be operated to perform operations that include, receiving, at a microcontroller of the fingerprint sensor device, raw sensor data from a sensor array in communication with the microcontroller, comparing the received raw sensor data against a predetermined threshold, and, based at least partly on the comparing, resetting power supplied to the fingerprint sensor device to recover from a latchup state.

9 Claims, 6 Drawing Sheets

LATCHUP RECOVERY MECHANISM FOR FINGERPRINT SENSOR BASED ON STATE MONITOR AND HANDSHAKE

CROSS REFERENCE TO RELATED APPLICATIONS

This patent document claims the benefit of priority under 35 U.S.C. § 119(a) and the Paris Convention of International Patent Application No. PCT/CN2014/091179, filed on Nov. 14, 2014. The entire content of the before-mentioned patent application is incorporated by reference as part of the disclosure of this document.

TECHNICAL FIELD

This patent document relates to latchup recovery for sensor pixel circuitry used in fingerprint identification.

BACKGROUND

Various electronic devices or information systems can employ user authentication mechanisms to protect personal data and prevent unauthorized access. User authentication on an electronic device or information system can be carried out through one or multiple forms of personal identification and authentication methods, including one or more biometric identifiers. A biometric identifier can be used alone or in addition to a conventional authentication method, such as a password authentication method. A popular form of biometric identifiers is a person's fingerprint pattern. A fingerprint sensor can be built into the electronic device to read a user's fingerprint pattern so that the device can only be unlocked by an authorized user of the device through authentication of the authorized user's fingerprint pattern. In some implementations, such as fingerprint sensor can include sensor pixel circuitry with pixelated pixel sensor elements for capturing fingerprint patterns for user identification.

SUMMARY

This patent document describes technology for providing devices, systems, and techniques to perform latchup recovery for fingerprint sensor circuitry based partly on state monitoring and handshake mechanisms.

The technologies described in this patent document can provide a mechanism for recovering from a latchup condition in sensor pixel circuitry used in a fingerprint identification system.

In one aspect, a method of recovering from latchup state in a fingerprint sensor device is described. The method includes receiving, at a microcontroller of the fingerprint sensor device, raw sensor data from a sensor array in communication with the microcontroller. The method includes comparing the received raw sensor data against a predetermined threshold. The method includes based at least partly on the comparing, resetting power supplied to the fingerprint sensor device to recover from a latchup state.

The method can be implemented in various ways to include one or more of the following features. Based at least partly on the comparing, resetting power supplied to the fingerprint sensor device to recover from a latchup state can include determining that the fingerprint sensor is in a latchup state when the received raw sensor data fails to satisfy the predetermined threshold. Resetting power supplied to the fingerprint sensor device includes: turning off a low drop-off regulator (LDO) to turn off power supplied to the fingerprint sensor device; keeping the power off for a period of time to recover from the latch up condition; and turning back on the LDO to restore power supplied to the fingerprint sensor device.

In another aspect, a method of recovering from a latchup state in a device including a fingerprint sensor device is describes. The method includes reading, at a host processor of the device, an initial checksum stored in memory. The method includes reading, at the host processor, a checksum calculated by a microcontroller of the fingerprint sensor device. The method includes comparing the two read checksums for a match; and resetting the microcontroller based at least partly on the comparing to recover from a latchup state.

The method can be implemented in various ways to include one or more of the following features. Resetting the microcontroller based at least partly on the comparing can include determining that the microcontroller is in the latchup state when the compared checksums do not match.

In another aspect, a method of recovering from a latchup state in a device that includes a fingerprint sensor device is described. The method includes requesting, at a host processor of the device, a handshake confirmation with a microcontroller of the fingerprint sensor device. The method includes resetting the microcontroller when determining that the microcontroller fails to complete the requested handshake confirmation.

The methods described in this patent document can be implemented in a device that includes a fingerprint sensor device without using additional hardware.

In another aspect, a fingerprint sensor device includes a sensor array to detect raw fingerprint sensor data; a power controller electrically connected between the sensor array and a power supply to control transmission of power from the power supply to the sensory array; and a microcontroller in communication with the sensor array and the power controller. The microcontroller can perform operations including: receive the detected raw sensor data from the sensor array; compare the received raw sensor data against a predetermined threshold that indicates a latchup state, and based at least partly on the comparing, transmit a signal to the power controller to cause the power controller to reset the power supplied to the fingerprint sensor device to recover from the latchup state.

The fingerprint sensor device can be implemented in various ways to include one or more of the following features. For example, the power controller can include a low drop-out (LDO) regulator. The microcontroller can determine that the fingerprint sensor is in the latchup state when the received raw sensor data fails to satisfy the predetermined threshold. The microcontroller can transmit the signal that includes a signal to turn off the power controller to cut off the power from the power supply. The microcontroller can keep the power controller off for a period of time to shut off the power off for the period and recover from the latch up condition. The microcontroller can turn back on the power controller to restore power supplied to the fingerprint sensor device.

In yet another aspect an electronic device can include a fingerprint sensor device. The fingerprint sensor device can include a sensor array configured to detect raw fingerprint sensor data, and a microcontroller in communication with the sensor array, the microcontroller configured to calculate a checksum. The electronic device can include a host processor in communication with the microcontroller of the fingerprint sensor device. The host processor can perform operations including: read an initial checksum stored in memory, read the checksum calculated by the microcontroller of the fingerprint sensor device, compare the two read checksums for an indication that the microcontroller is in a latchup state, and reset the microcontroller based at least partly on the comparing to recover from the latchup state.

The electronic device can be implemented in various ways to include one or more of the following features. For example, the host processor can determine that the microcontroller is in the latchup state when the compared checksums do not match. The electronic device can include a smartphone, a tablet, a laptop, or a wearable device.

In yet another aspect an electronic device can include a fingerprint sensor device. The fingerprint sensor device can include a sensor array to detect raw fingerprint sensor data, and a microcontroller in communication with the sensor array. The electronic device can include a host processor in communication with the microcontroller of the fingerprint sensor device. The host processor can perform operations including: request a handshake confirmation with the microcontroller of the fingerprint sensor device, and reset the microcontroller when determining that the microcontroller fails to complete the requested handshake confirmation.

The electronic device can be implemented to include one or more of the following features. For example, the host processor can determine that the microcontroller is in a latchup state when determining that the microcontroller fails to complete the requested handshake confirmation.

In some implementation, latchup detection and recovery described in this patent document can be implemented in a device that includes a fingerprint sensor device and dedicated electrostatic discharge detection circuitry hardware.

For example, a fingerprint sensor device for an electronic device can include a sensor array to detect raw fingerprint sensor data; a microcontroller in communication with the sensor array; and electrostatic discharge detection circuitry in communication with the sensor array and the microcontroller. The electrostatic discharge circuitry can perform operations including: detect an abnormal voltage or current signal indicating an electrostatic discharge event, and bypass a clock signal via the microcontroller to stop device operation.

The fingerprint sensor device can be implemented in various ways to include one or more of the following features. For example, the electrostatic discharge detection circuitry can cause the detected abnormal voltage or current signal to be discharged. The electrostatic discharge detection circuitry can re-enable the clock signal after the discharge. The electrostatic discharge detection circuitry can communicate with the microcontroller of the electrostatic discharge event.

In yet another aspect, an electronic device includes a host processor; and a fingerprint sensor device in communication with the host processor. The fingerprint sensor device includes: a sensor array configured to detect raw fingerprint sensor data, a microcontroller in communication with the sensor array and electrostatic discharge detection circuitry in communication with the sensor array and the microcontroller. The electrostatic discharge detection circuitry can perform operations including: detect an abnormal voltage or current signal indicating an electrostatic discharge event, and bypass a clock signal via the microcontroller to stop device operation.

The electronic device can be implemented in various ways to include one or more of the following features. For example, the electrostatic discharge detection circuitry can cause the detected abnormal voltage or current signal to be discharged. The electrostatic discharge detection circuitry can re-enable the clock signal after the discharge. The electrostatic discharge circuitry can communicate with the microcontroller and the host processor of the electrostatic discharge event. The host processor can perform self-check and restore a state and a logic process. The microcontroller can perform a self-check and restore a state and a logic process.

In yet another aspect, a method of recovering from a latchup state in an electronic device that includes a fingerprint sensor device is disclosed. The method includes detecting, at electrostatic discharge detection circuitry, an abnormal voltage or current signal indicating an electrostatic discharge event; and bypassing a clock signal to stop error causing operation of the electronic device.

The method can be implemented in various ways to include one or more of the following features. For example, the method can include discharging the detected abnormal voltage or current. The method can include re-enabling the clock signal after the discharging. The method can include indicating to the microcontroller and the host processor of the electrostatic discharge event. The method can include performing, at the host processor, a self-check and restoring a state and a logic process. The method can include performing, at the microcontroller, a self-check and restoring a state and a logic process.

The above and other aspects and their implementations are described in greater detail in the drawings, the description and the claims.

DETAILED DESCRIPTION

In a device that includes fingerprint circuitry, electrostatic discharge (ESD) can cause excessive power flow throughout the fingerprint circuitry and the device to cause a latchup condition in the fingerprint circuitry and the device. In addition, the ESD event can damage the fingerprint circuitry and the device, and even cause harm to the user in contact with device. ESD can enter the device having the fingerprint circuitry due to the array of sensing electrodes (e.g., capacitive or otherwise) that are disposed close the sensing surface of the device where a user's finger is placed to perform fingerprint detection. The user's finger touching the sensing surface to initiate fingerprint detection can cause the ESD.

Because the fingerprint circuitry tend to be disposed in close physical distance from other computing components of the device such as a processor or a controller, the ESD that causes excessive power flow through the fingerprint circuitry can flow through the closely located processors or controllers and cause the processor and controller to malfunction. The technology disclosed in this patent document describes a mechanism for detecting a latchup condition and recovering from the detected latchup condition. The described mechanism for detecting and recovering from a latchup condition does not depend on or require added circuitry or other hardware. Existing hardware such as a host processor and a fingerprint sensor device that includes a microcontroller can be used to implement the described latchup detection and recovery mechanism.

Figure 1:
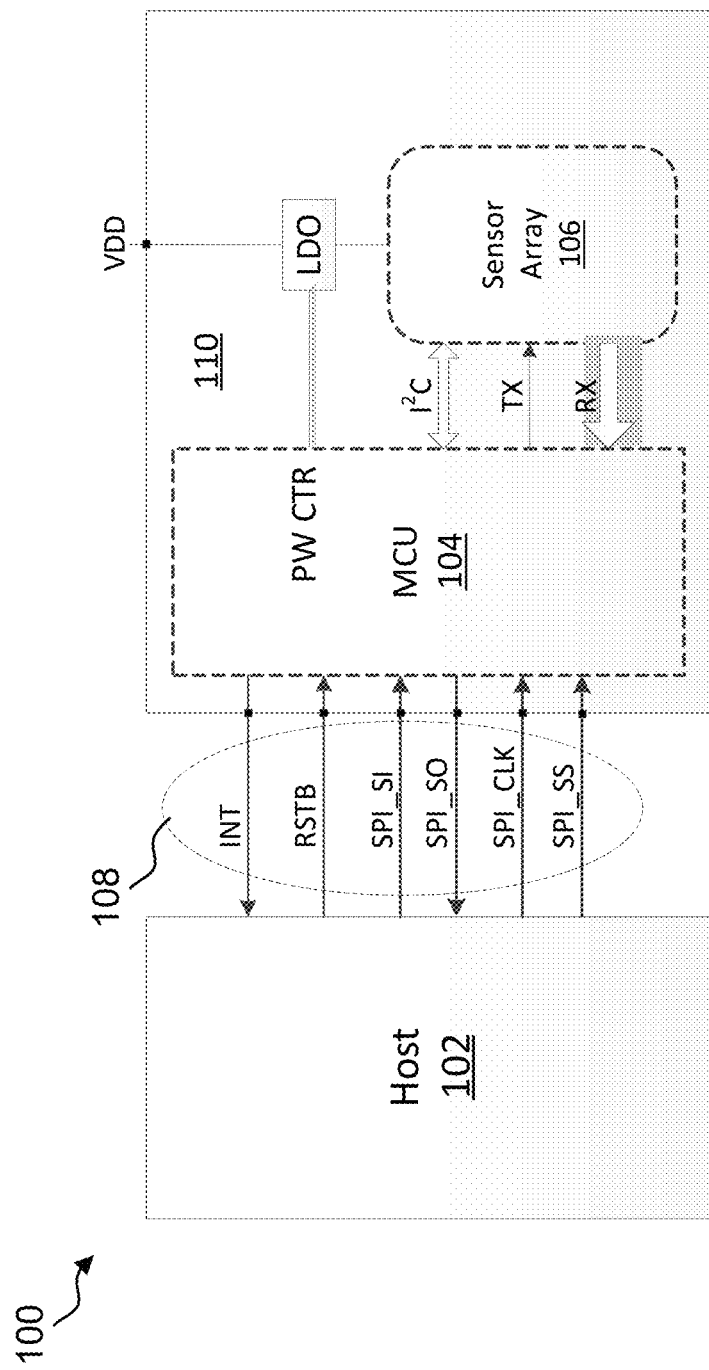
FIG. 1 is a block diagram illustrating an exemplary latchup recovery mechanism implemented in a device with a fingerprint sensor.

FIG. 1 is a block diagram illustrating an exemplary latchup recovery mechanism implemented in a device 100 with a fingerprint sensor. The device 100 can be any electronic device that includes a fingerprint sensor for providing secure access to the device 100. For example, the device 100 can include a portable device such as a smartphone, a tablet, a laptop, smartwatch, etc. The device 100 includes various electronic circuitry and components such as a host processor 102 communicatively coupled with a fingerprint sensor device 110 (e.g. a chip). The host processor 102 communicates with the fingerprint sensor device 110 to receive sensor data from the sensor array 106 included in the fingerprint sensor device 110. The host processor communicates with the fingerprint sensor device 110 by performing a handshake with the microcontroller unit (MCU) 104 in the fingerprint sensor device 110. Once a successful handshake has been completed between the host processor 102 and the MCU 104, the host processor 102 and the fingerprint sensor device 110 can communicate with each other to send and receive various signals including requests, commands, data, etc. Examples of communicated signals between the host processor 102 and the MCU 104 are shown in FIG. 1 as reference number 108.

The MCU 104 controls the operation of the sensor array 106 including controlling power (PW CTR) to sensor array 106. Power control can be performed using a low drop-out (LDO) regulator to turn on and off power from a power supply (VDD) to the sensor array 106. In addition, communication of various signals between the MCU 104 and the sensor array 106 can be possible including TX (transmission), RX (reception) and I²C (inter-integrated circuit). For example, sensor output data from the individual sensors in the sensor array 106 can be sent to the MCU 104 in response to a request from the MCU 104. The MCU 104 can relay or forward the received sensor data to the host processor 102 post processing or before processing.

Figure 2:
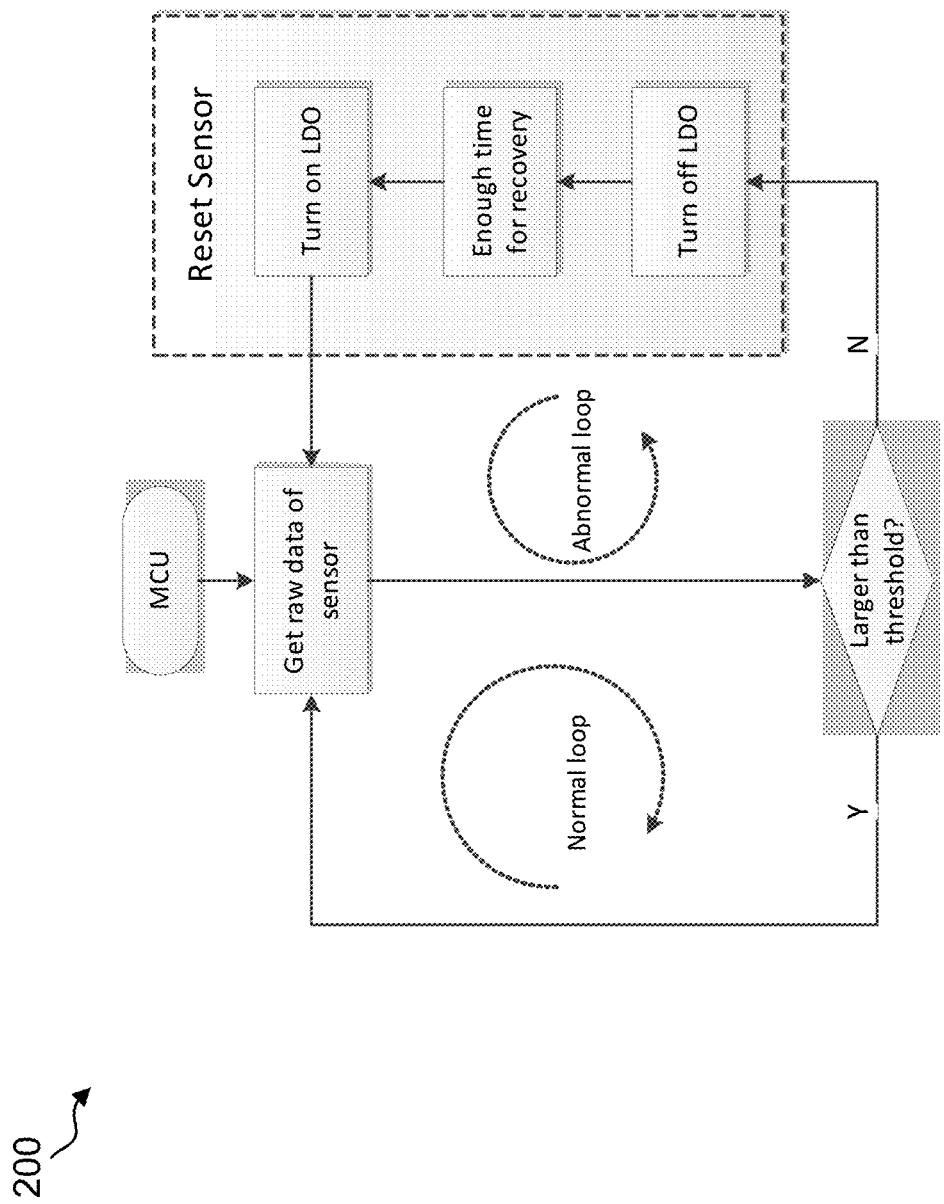
FIG. 2 is a process flow diagram of an exemplary process for detecting a latchup condition based on raw sensor output data comparison.

When ESD or other disturbances can cause a latchup condition, the fingerprint sensor device 110 and the host processor 102 can be affected. FIG. 2 is a process flow diagram of an exemplary process for detecting a latchup condition based on raw sensor output data comparison. The fingerprint sensor 106 entering a latchup condition due to ESD or other disturbance can be detected based on the raw sensor output data from individual sensors in the sensor array 106. The MCU 104 can receive the raw data from the sensors in the sensor array 106. When the MCU 104 determines that the received raw sensor data is larger than a predetermined threshold, the fingerprint sensor device 106 is determined to be not in a latchup condition. This normal operation is shown as the normal loop on the left hand side of the flow diagram. When the MCU 104 determines that the received raw sensor data is less than a predetermined threshold, MCU 104 determines that the fingerprint sensor device 106 is in a latchup condition and the MCU 104 will reset power supplied to the fingerprint sensor device 106 to recover from the latchup condition. The process of recovering from the latchup condition can include turning off the LDO to turn off power supplied to the fingerprint sensor device 106; keep the power off for a period of time needed to recover from the latch up condition; and turning back on the LDO to restore power supplied to the fingerprint sensor device 106.

Figure 3:
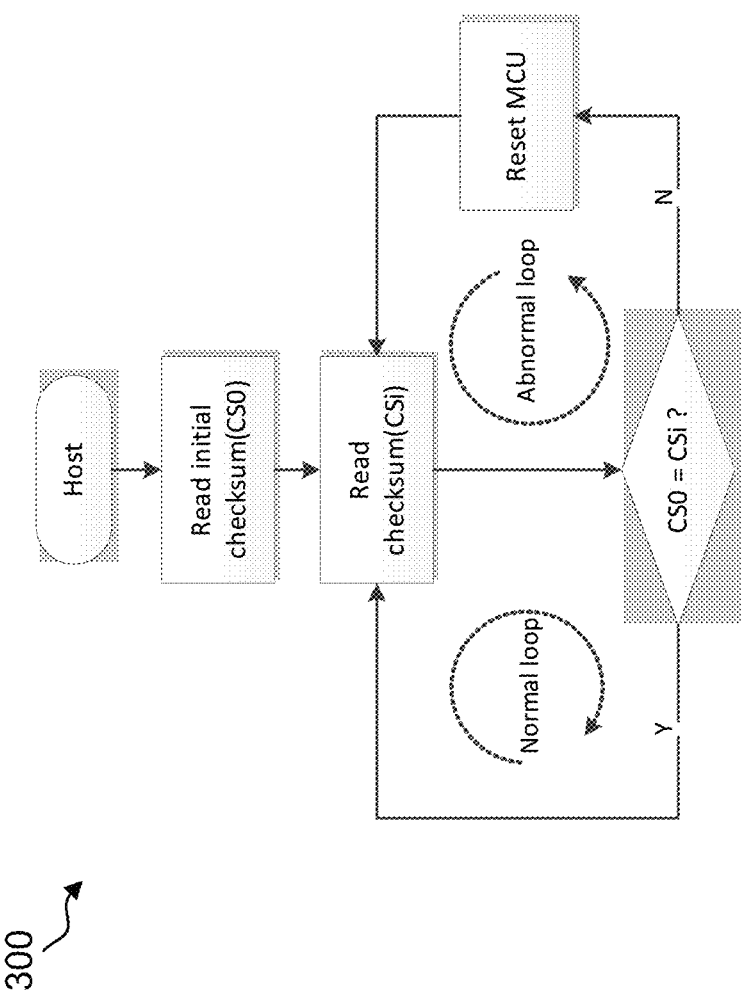
FIG. 3 is a process flow diagram of an exemplary process for performing latchup detection and recovery based on checksum confirmation.

FIG. 3 is a process flow diagram of an exemplary process for performing latchup detection and recovery based on checksum confirmation. When the ESD or other disturbances affect the MCU 104, the MCU 104 itself can enter a latch up condition or state. With the MCU 104 is unable to perform latchup recovery, the host processor 102 can perform latchup recovery. When the MCU 104 is in the latchup condition or state, the SRAM segment with constants may change. The host can determine whether the MCU 104 is in the latchup condition by comparing the initial checksum with calculated checksum by MCU 104. The latchup recovery process performed by the host processor 102 can include reading the initial checksum; reading the checksum calculated by the MCU 104; and comparing whether the two checksums match. When the two checksums do not match, the host processor 102 determines that the MCU 104 is in the latchup condition or state and will reset the MCU 104. This abnormal or latchup condition is represented by the abnormal loop on the right hand side of the process flow diagram. When the host processor 102 determines that the two checksums match, the host processor 102 determines that the MCU 104 is not in a latchup condition or state and will not reset the MCU 104. This normal operation is represented by the normal loop on the left hand side of the process flow diagram. The host processor can continue to compare the two checksums to make the determination of whether the MCU 104 is in the latchup condition or state.

Figure 4:
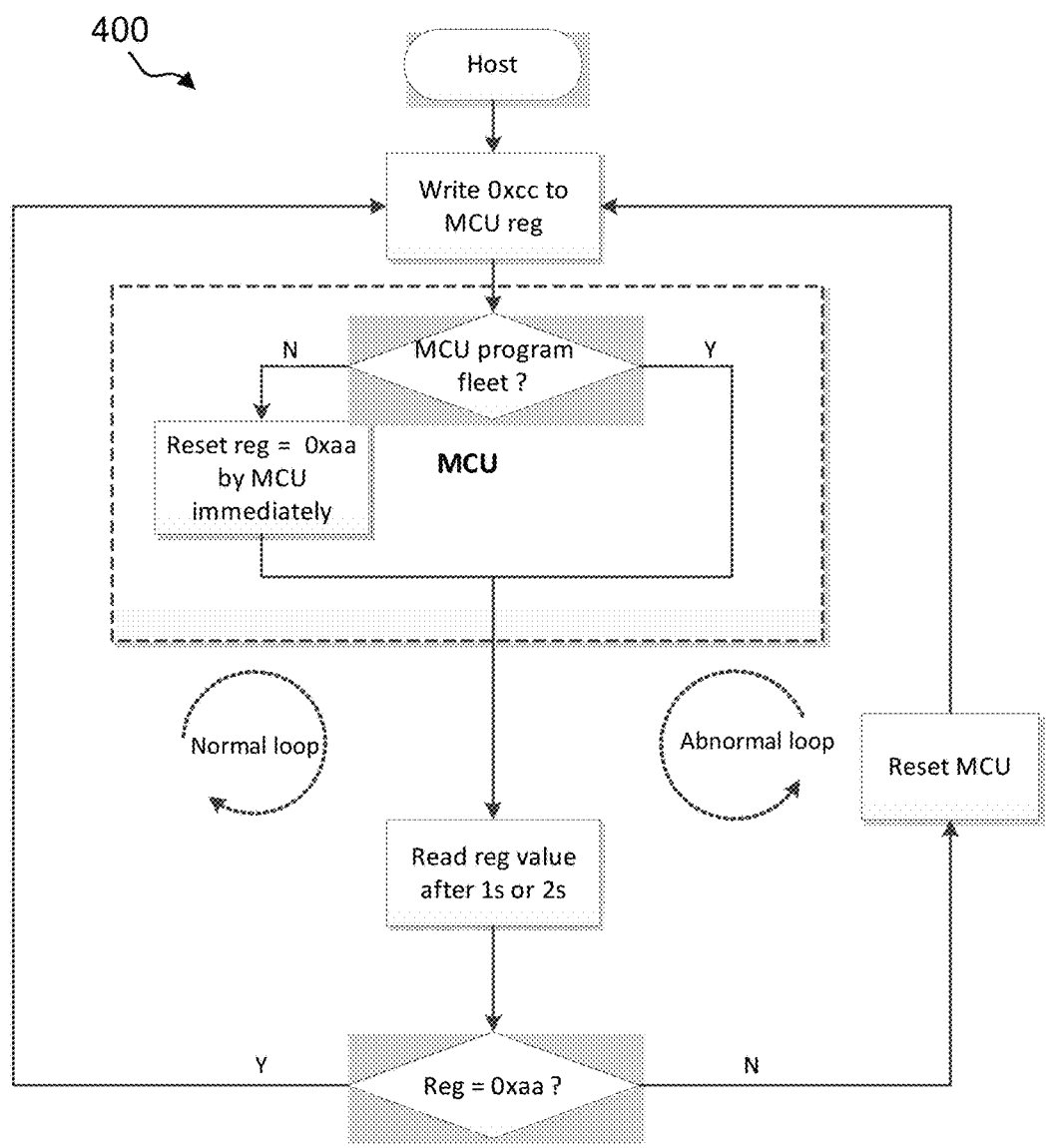
FIG. 4 is a process flow diagram of an exemplary process for performing latchup detection and recovery based on handshake confirmation.

FIG. 4 is a process flow diagram of an exemplary process for performing latchup detection and recovery based on handshake confirmation. In some implementations, the host processor 102 can determine whether that MCU 104 is in the latchup condition or state based on completion of handshake confirmation. When the MCU 104 is in the latchup condition or state, MCU's code segment may be changed by ESD or other disturbances. When the MCU's code segment is changed, the host processor 102 cannot complete handshake with MCU 104 in case of its program fleet. When the host processor 102 determines that the MCU 104 does not complete handshake with the host processor 102, the host processor determines that the MCU 104 is in the latchup condition or state and will reset the MCU 104. This abnormal operation is represented by the abnormal loop on the right hand side of the process flow diagram. When the host processor 102 determines that the MCU 104 completes handshake confirmation, the host processor 102 determines that the MCU 104 is not in the latchup condition or state and the host processor 102 will not reset the MCU.

Figure 5:
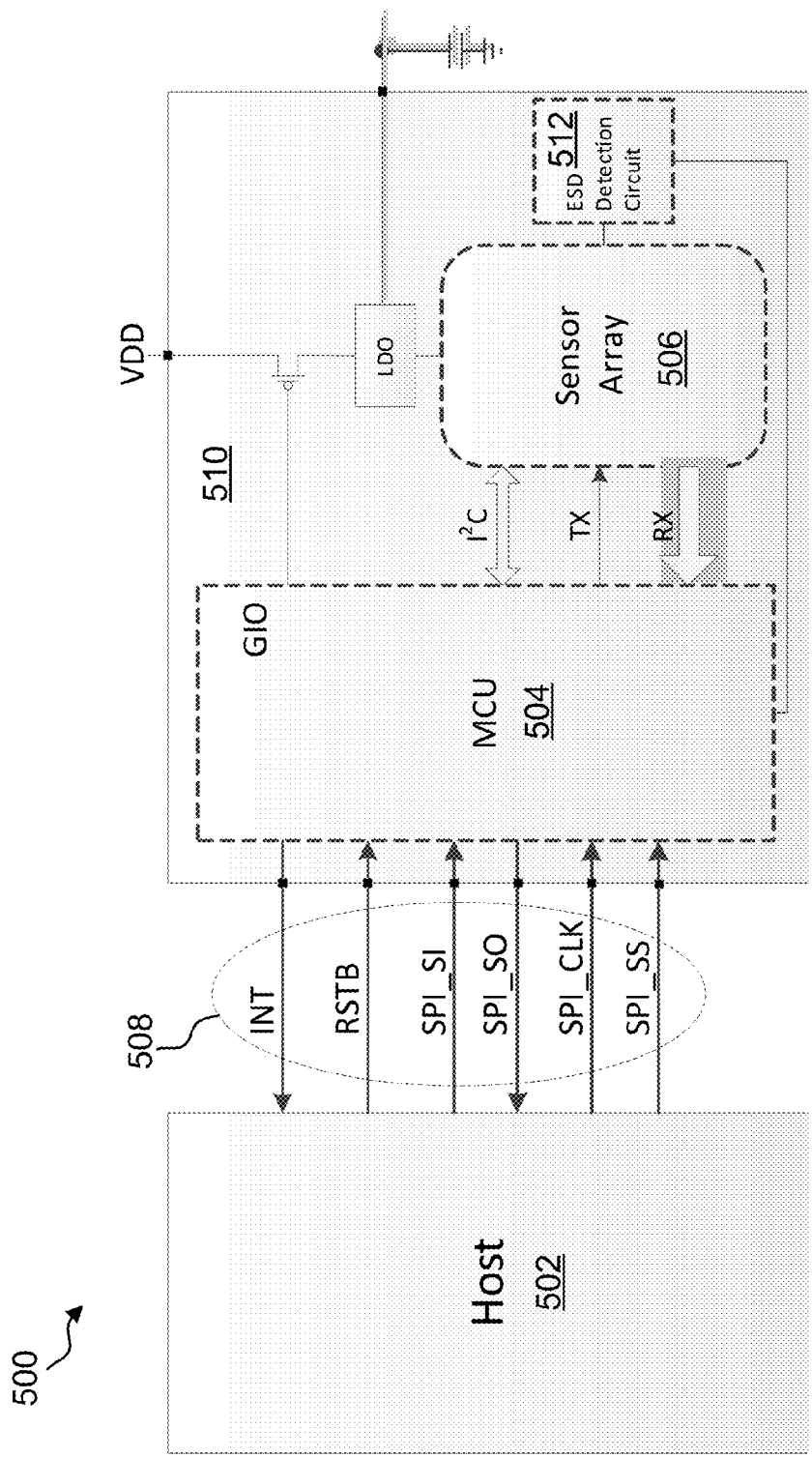
FIG. 5 is a block diagram illustrating another exemplary latchup recovery mechanism implemented in a device with a fingerprint sensor.

FIG. 5 is a block diagram illustrating another exemplary latchup recovery mechanism implemented in a device 500 with a fingerprint sensor device 510. The device 500 can be any electronic device that includes a fingerprint sensor device for providing secure access to the device 500. For example, the device 500 can include a portable device such as a smartphone, a tablet, a laptop, smartwatch, etc. The device 100 includes various electronic circuitry and components such as a host processor 502 communicatively coupled with a fingerprint sensor device 510 (e.g. a chip). The host processor 502 communicates with the fingerprint sensor device 510 to receive sensor data from the sensor array 506 included in the fingerprint sensor device 510. The host processor 502 communicates with the fingerprint sensor device 110 via an input/output (I/O) interface 508 by performing a handshake with the microcontroller unit (MCU) 504 in the fingerprint sensor device 510. Once a successful handshake has been completed between the host processor 502 and the MCU 504, the host processor 502 and the fingerprint sensor device 510 can communicate with each other to send and receive various signals including requests, commands, data, etc. A number of examples of communicated signals between the host processor 502 and the MCU 504 via the I/O interface 508 are shown in FIG. 5.

The MCU 504 controls the operation of the sensor array 506 including controlling power to sensor array 506. Power control can be performed using an LDO regulator to turn on and off power from a power supply (VDD) to the sensor array 506. In addition, communication of various signals between the MCU 504 and the sensor array 506 can be possible including TX (transmission), RX (reception) and I²C (inter-integrated circuit). For example, sensor output data from the individual sensors in the sensor array 506 can be sent to the MCU 504 in response to a request from the MCU 504. The MCU 504 can relay or forward the received sensor data to the host processor 502 post processing or before processing.

Also, an ESD detection circuitry 512 is in communication with the MCU 504 and the sensor array 506 to complete the recovery mechanism after a latchup condition caused by an ESD event. The ESD detection circuitry 512 can prevent a high voltage signal generated by the ESD event from directly interacting with the electronic device 500, which can damage the device 500. The ESD detection circuitry can be implemented using different circuitry including a ESD discharge tube or circuitry.

For example, the ESD event can cause a high voltage (usually higher than 4000V) signal to enter the I/O interface 508, increasing the voltage of the internal power supply. An ESD discharge tube in the ESD detection circuitry 512 can limit the voltage of an internal power supply from increasing beyond a threshold level. The ESD discharge tube in the ESD detection circuitry 512 can open to enable the I/O interface to release the electric charge previously stored and forms a large current as an abnormal current or a large voltage as an abnormal voltage.

Figure 6:
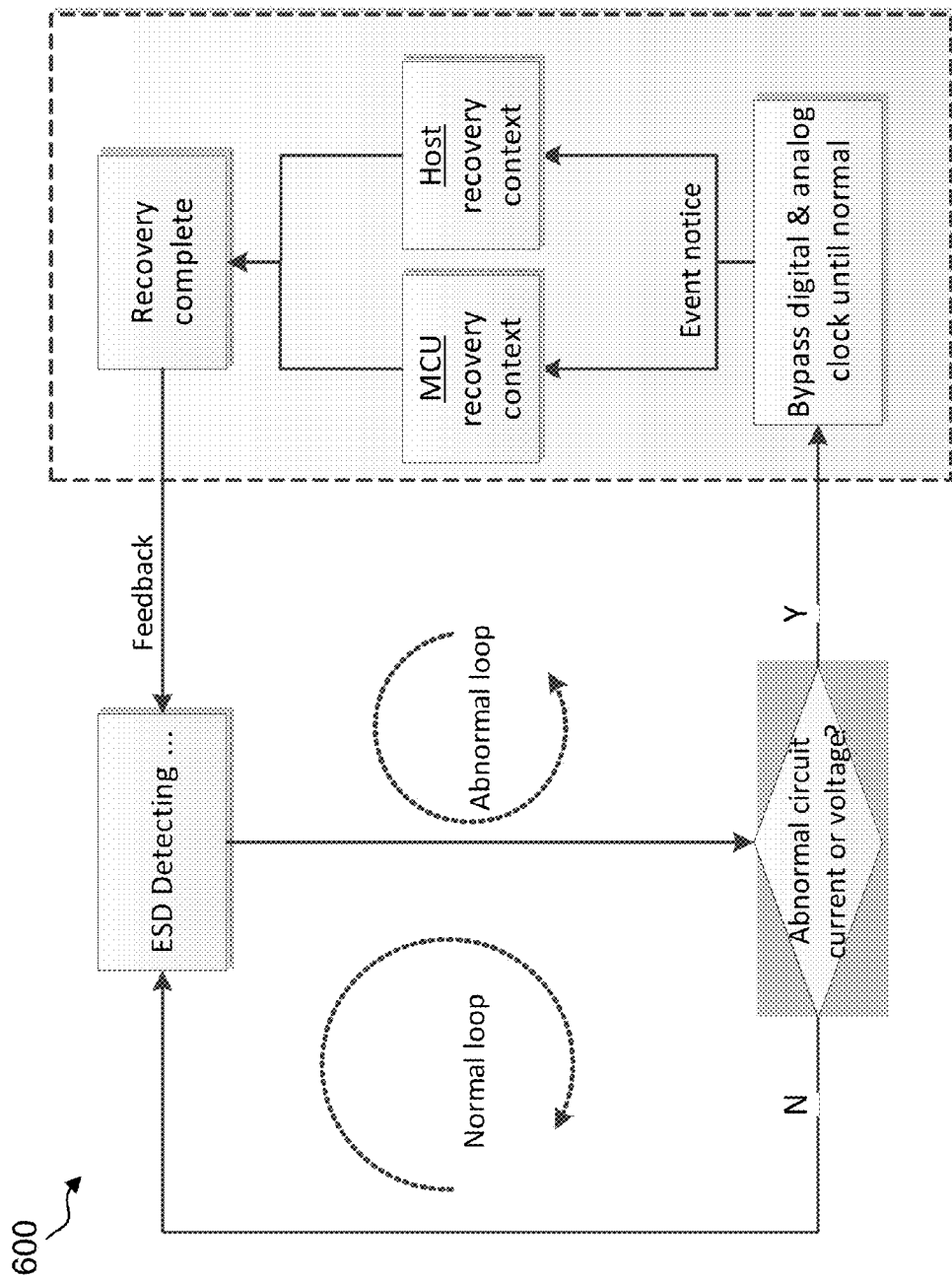
FIG. 6 is a process flow diagram of an exemplary process for detecting a latchup condition based electrostatic discharge (ESD) detection.

FIG. 6 is a process flow diagram of an exemplary process 600 for detecting a latchup condition using the ESD detection circuitry. The process 600 shows a normal loop on the left-hand side and an abnormal loop on the right hand side. In the abnormal loop, when the ESD detection circuitry 512 detects the abnormal voltage or current generated due to an ESD event, the ESD detection circuitry bypasses the system or device clock (both digital and analog) to stop the system or device 500 from operating to avoid errors that could occur under the abnormal voltage or current. After a period of discharging the abnormal current or voltage, the ESD detection circuitry 512 can re-enable the system or device clock when the voltage or current is back to a normal operating range, and inform the host processor 502 and the MCU 504 of the abnormal condition that occurred. The host processor 502 and the MCU 504 can perform self-check and restore corresponding context (e.g., the state and logical process) until the recovery mechanism is completed.

The process 600 operates in the normal loop when the current or the voltage is in the normal operating range.

Various implementations and examples of the disclosed technology have been described. The disclosed technology utilizes integrators for storing the electric charges accumulated by the touch sensing capacitor, utilizes the voltage generator for outputting the variable voltage and adjusting the electric charges stored in the parasitic capacitors, and utilizes the sensor pixel circuitry with a dedicated integrator for performing integration across a group of sensor pixel circuitry in parallel to enhance the SNR. The sensor pixel circuitry and the fingerprint identification system described in this patent document provide accurate fingerprint identification even without a metal ring.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method of recovering from latchup state in a fingerprint sensor device, the method comprising:
   receiving, at a microcontroller of the fingerprint sensor device, raw sensor data from a sensor array in communication with the microcontroller;
   comparing the received raw sensor data against a predetermined threshold; and
   based at least partly on the comparing, resetting power supplied to the fingerprint sensor device to recover from a latchup state.

2. The method of claim 1, wherein based at least partly on the comparing, resetting power supplied to the fingerprint sensor device to recover from a latchup state includes determining that the fingerprint sensor is in a latchup state when the received raw sensor data fails to satisfy the predetermined threshold.

3. The method of claim 1, wherein resetting power supplied to the fingerprint sensor device includes:
   turning off a low drop-off regulator (LDO) to turn off power supplied to the fingerprint sensor device;
   keeping the power off for a period of time to recover from the latch up condition; and
   turning back on the LDO to restore power supplied to the fingerprint sensor device.

4. A fingerprint sensor device, comprising:
   a sensor array configured to detect raw fingerprint sensor data;
   a power controller electrically connected between the sensor array and a power supply to control transmission of power from the power supply to the sensory array; and a microcontroller in communication with the sensor array and the power controller, wherein the microcontroller is configured to perform operations including:
receive the detected raw sensor data from the sensor array;
compare the received raw sensor data against a predetermined threshold that indicates a latchup state, and
based at least partly on the comparing, transmit a signal to the power controller to cause the power controller to reset the power supplied to the fingerprint sensor device to recover from the latchup state.

5. The fingerprint sensor device of claim 4, wherein the power controller includes a low drop-out (LDO) regulator.

6. The fingerprint sensor device of claim 4, wherein the microcontroller is configured to determine that the fingerprint sensor is in the latchup state when the received raw sensor data fails to satisfy the predetermined threshold.

7. The fingerprint sensor device of claim 4, wherein the microcontroller is configured to transmit the signal that includes a signal to turn off the power controller to cut off the power from the power supply.

8. The fingerprint sensor device of claim 7, wherein the microcontroller is configured to keep the power controller off for a period of time to shut off the power off for the period and recover from the latch up condition.

9. The fingerprint sensor device of claim 7, wherein the microcontroller is configured to turn back on the power controller to restore power supplied to the fingerprint sensor device.

\* \* \* \* \*